(12) United States Patent
Xu

(10) Patent No.: US 11,322,713 B2
(45) Date of Patent: May 3, 2022

(54) DISPLAY SUBSTRATE AND MANUFACTURING METHOD OF THE SAME, DISPLAY DEVICE

(71) Applicant: BOE TECHNOLOGY GROUP CO., LTD., Beijing (CN)

(72) Inventor: Pan Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 168 days.

(21) Appl. No.: 16/818,246

(22) Filed: Mar. 13, 2020

(65) Prior Publication Data
US 2021/0151711 A1 May 20, 2021

(30) Foreign Application Priority Data

Nov. 14, 2019 (CN) .......................... 201911111276.6

(51) Int. Cl.
*H01L 51/52* (2006.01)
*H01L 27/32* (2006.01)
*H01L 51/56* (2006.01)

(52) U.S. Cl.
CPC ...... *H01L 51/5228* (2013.01); *H01L 27/3246* (2013.01); *H01L 27/3258* (2013.01); *H01L 27/3272* (2013.01); *H01L 27/3276* (2013.01); *H01L 51/5225* (2013.01); *H01L 51/56* (2013.01); *H01L 2227/323* (2013.01); *H01L 2251/558* (2013.01)

(58) Field of Classification Search
CPC ......................... H01L 27/3246; H01L 51/5228
See application file for complete search history.

(56) References Cited

U.S. PATENT DOCUMENTS

| 2015/0097171 | A1  | 4/2015 | Kim et al.  |            |
|--------------|-----|--------|-------------|------------|
| 2017/0133620 | A1* | 5/2017 | Lee ........ | H01L 27/3246 |
| 2018/0122882 | A1* | 5/2018 | Lee ........ | H01L 27/3258 |
| 2019/0074338 | A1  | 3/2019 | Gu          |            |
| 2021/0257581 | A1  | 8/2021 | Wang et al. |            |

FOREIGN PATENT DOCUMENTS

| CN | 107394060 A    | 11/2017 |
|----|----------------|---------|
| CN | 108292488 A    | 7/2018  |
| CN | 110085648 A    | 8/2019  |
| KR | 20150041509 A  | 4/2015  |
| WO | 2017127563 A1  | 7/2017  |

* cited by examiner

*Primary Examiner* — Daniel P Shook
(74) *Attorney, Agent, or Firm* — The Webb Law Firm

(57) ABSTRACT

The present disclosure provides a display substrate, a manufacturing method thereof, and a display device. The display substrate includes: a backplane; a transistor layer on a side of the backplane; a first planarization layer on a side of the transistor layer away from the backplane; an auxiliary cathode layer on a side of the first planarization layer away from the transistor layer; a second planarization layer on a side of the auxiliary cathode layer away from the first planarization layer; and a light-emitting element layer on a side of the second planarization layer away from the auxiliary cathode layer. The light-emitting element layer includes a primary cathode layer electrically connected to the auxiliary cathode layer.

19 Claims, 4 Drawing Sheets

DISPLAY SUBSTRATE AND MANUFACTURING METHOD OF THE SAME, DISPLAY DEVICE

CROSS-REFERENCE TO RELATED APPLICATION

This application claims priority to Chinese Patent Application No. 201911111276.6 filed Nov. 14, 2019, the disclosure of which is hereby incorporated by reference in its entirety.

BACKGROUND OF THE INVENTION

The present disclosure relates to a display substrate, a manufacturing method thereof, and a display device.

FIELD OF THE INVENTION

With the maturity of Organic Light-Emitting Diode (OLED) technology, more and more users and research and development companies are now pursuing high-performance OLED display panels, such as high PPI (Pixels Per Inch, i.e., pixel density) display panels. Top emission technology is one of the effective means to achieve high PPI display. For top emission technology, the development of transparent cathodes and reflective anodes is needed. At present, IZO (Indium Zinc Oxide) having high transmittance is widely used in transparent cathodes. However, the resistivity of IZO is relatively large. If it is used in a display panel having a medium or large size, the impedance of the IZO cathode is relatively large. Because the impedance of the IZO cathode is large, the voltage drop (or Vss IR Rise) on the cathode is relatively large, resulting in a poor display effect of the display panel. Therefore, for a display panel having a medium or large size in which the top emission technology is adopted, a metal layer with a smaller resistivity can be provided as an auxiliary line of the cathode to reduce the impedance on the cathode. This technology is referred to as auxiliary cathode development technology.

In the known auxiliary cathode design, an auxiliary cathode is provided on the upper cover plate for a large-sized display panel. By bonding the auxiliary cathode to a transparent cathode, the purpose of reducing the impedance of the cathode is achieved.

SUMMARY OF THE INVENTION

According to an aspect of embodiments of the present disclosure, a display substrate is provided. The display substrate comprises: a backplane; a transistor layer on a side of the backplane; a first planarization layer on a side of the transistor layer away from the backplane; an auxiliary cathode layer on a side of the first planarization layer away from the transistor layer; a second planarization layer on a side of the auxiliary cathode layer away from the first planarization layer; and a light-emitting element layer on a side of the second planarization layer away from the auxiliary cathode layer, wherein the light-emitting element layer comprises a primary cathode layer electrically connected to the auxiliary cathode layer.

In some embodiments, a material of the first planarization layer and a material of the second planarization layer are organic insulating materials.

In some embodiments, a thickness of the first planarization layer ranges from 0.5 micrometers to 5 micrometers; and a thickness of the second planarization layer ranges from 0.5 micrometers to 5 micrometers.

In some embodiments, the light-emitting element layer further comprises: a pixel defining layer for defining a pixel light-emitting opening; an anode layer on a side of the second planarization layer away from the auxiliary cathode layer, wherein the anode layer is electrically connected to the transistor layer; and a light-emitting function layer on a side of the anode layer away from the second planarization layer, wherein the light-emitting function layer is in the pixel light-emitting opening; wherein the primary cathode layer is on a side of the light-emitting function layer away from the anode layer.

In some embodiments, the display substrate further comprises: a conductive layer that is on the same layer as the anode layer and is isolated from the anode layer; wherein the primary cathode layer is electrically connected to the conductive layer through a first via-hole passing through the pixel defining layer, and the conductive layer is electrically connected to the auxiliary cathode layer through a second via-hole passing through the second planarization layer.

In some embodiments, an orthographic projection of the first via-hole on the backplane does not overlap with an orthographic projection of the second via-hole on the backplane.

In some embodiments, an orthographic projection of the first via-hole on the backplane at least partially overlaps with an orthographic projection of the second via-hole on the backplane.

In some embodiments, the auxiliary cathode layer has a grid shape.

In some embodiments, the display substrate comprises a display area and a peripheral area surrounding the display area, the auxiliary cathode layer being disposed in the display area.

In some embodiments, the primary cathode layer is electrically connected to a common wire for transmitting a common ground voltage signal, the common wire is disposed in the peripheral area, and the auxiliary cathode layer is electrically connected to the common wire through the primary cathode layer.

In some embodiments, the transistor layer comprises: an active layer on a side of the backplane; a gate insulating layer on a side of the active layer away from the backplane; a gate layer on a side of the gate insulating layer away from the active layer; and a first electrode and a second electrode each electrically connected to the active layer, wherein the anode layer is electrically connected to the first electrode through a third via-hole passing through the first planarization layer and the second planarization layer.

In some embodiments, the display substrate further comprises: a buffer layer between the backplane and the transistor layer; and a shielding layer between the buffer layer and the backplane, wherein an orthographic projection of the shielding layer on the backplane at least partially overlaps with an orthographic projection of the light-emitting function layer on the backplane.

According to another aspect of embodiments of the present disclosure, a display device is provided. The display device comprises a display substrate described above.

According to another aspect of embodiments of the present disclosure, a manufacturing method for a display substrate is provided. The manufacturing method comprises: forming a transistor layer on a side of a backplane; forming a first planarization layer on a side of the transistor layer away from the backplane; forming an auxiliary cathode layer on aside of the first planarization layer away from the transistor layer; forming a second planarization layer on a side of the auxiliary cathode layer away from the first planarization layer; and forming a light-emitting element layer on a side of the second planarization layer away from the auxiliary cathode layer, wherein the light-emitting element layer comprises a primary cathode layer electrically connected to the auxiliary cathode layer.

In some embodiments, the forming of the light-emitting element layer comprises: forming an anode layer on a side of the second planarization layer away from the auxiliary cathode layer, wherein the anode layer is electrically connected to the transistor layer; forming a pixel defining layer covering the anode layer, the pixel defining layer being provided with a pixel light-emitting opening exposing at least a portion of the anode layer; forming a light-emitting function layer in the pixel light-emitting opening and on the anode layer; and forming the primary cathode layer on a side of the light-emitting function layer away from the anode layer.

In some embodiments, in a process of forming the anode layer, a conductive layer that is on the same layer as the anode layer and is isolated from the anode layer is also formed; the forming of the conductive layer comprises: forming a second via-hole passing through the second planarization layer, the second via-hole exposing a portion of the auxiliary cathode layer, and forming the conductive layer electrically connected to the portion of the auxiliary cathode layer through the second via-hole; and the forming of the primary cathode layer comprises: forming a first via-hole passing through the pixel defining layer, the first via-hole exposing at least a portion of the conductive layer, and forming the primary cathode layer electrically connected to the at least a portion of the conductive layer through the first via-hole.

In some embodiments, an orthographic projection of the first via-hole on the backplane does not overlap with an orthographic projection of the second via-hole on the backplane.

In some embodiments, an orthographic projection of the first via-hole on the backplane at least partially overlaps with an orthographic projection of the second via-hole on the backplane.

In some embodiments, the forming of the transistor layer comprises: forming an active layer on a side of the backplane; forming a gate insulating layer on a side of the active layer away from the backplane; forming a gate layer on a side of the gate insulating layer away from the active layer; and forming a first electrode and a second electrode each electrically connected to the active layer; and the forming of the anode layer comprises: forming a third via-hole passing through the first planarization layer and the second planarization layer, and forming the anode layer electrically connected to the first electrode through the third via-hole.

In some embodiments, before forming the transistor layer, the manufacturing method further comprises: forming a shielding layer on a side of the backplane; and forming a buffer layer covering the shielding layer and the backplane; wherein the transistor layer is formed on a side of the buffer layer away from the backplane; after forming the light-emitting function layer, an orthographic projection of the shielding layer on the backplane at least partially overlaps with an orthographic projection of the light-emitting function layer on the backplane.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute a portion of this specification, illustrate embodiments of the present disclosure and, together with the description, serve to explain the principles of the present disclosure.

The present disclosure will be more clearly understood from the following detailed description with reference to the accompanying drawings, in which.

Figure 1:
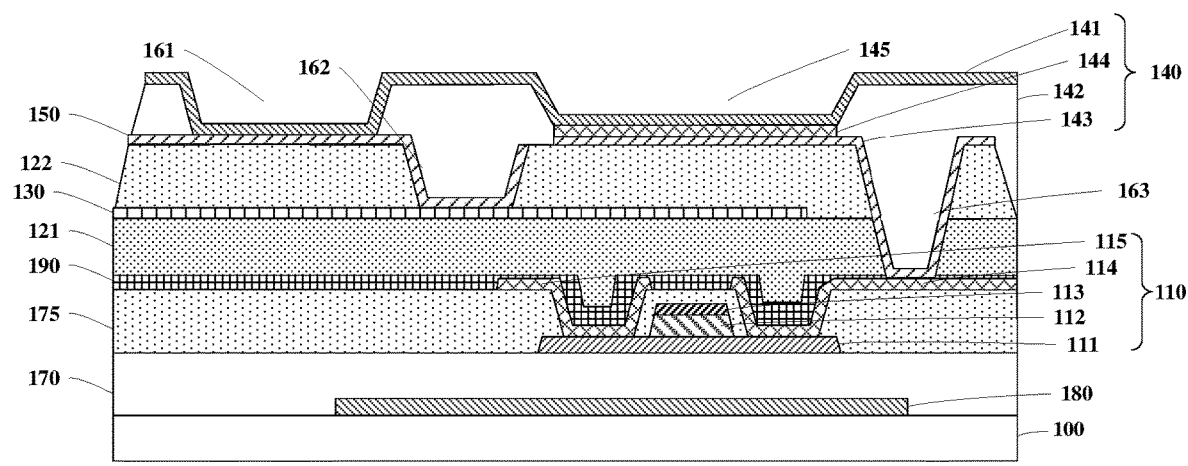
FIG. 1 is a schematic cross-sectional view showing a display substrate according to an embodiment of the present disclosure.

It should be understood that the dimensions of the various parts shown in the drawings are not drawn to the actual scale. In addition, the same or similar reference signs are used to denote the same or similar components.

DESCRIPTION OF THE INVENTION

Various exemplary embodiments of the present disclosure will now be described in detail with reference to the accompanying drawings. The following description of the exemplary embodiments is in fact merely illustrative and is in no way intended as a limitation to the present disclosure, its application or use. The present disclosure may be implemented in many different forms, not limited to the embodiments described herein. These embodiments are provided so that this disclosure will be thorough and complete, and will fully convey the scope of the disclosure to those skilled in the art. Notice that, Unless specifically stated otherwise, relative arrangement of components and steps, material composition, numerical expressions, and numerical values set forth in these embodiments are to be construed as merely illustrative, and not as a limitation.

The use of the terms "first", "second" or the like in the present disclosure does not denote any order, quantity or importance, but are merely used to distinguish between different components. A word such as "comprise" or "include" means that the element before the word covers the elements listed after the word, without excluding the possibility of also covering other elements. The terms "up", "down", "left", "right" or the like are used only to represent a relative positional relationship, and the relative positional relationship may be changed if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventor of the present disclosure has found that the above-mentioned known technology requires the auxiliary cathode to be formed on a side of the cover plate and then bonded to the transparent cathode. This bonding is likely to cause relatively large damage to the light-emitting device.

In view of this, an embodiment of the present disclosure provides a display substrate, in which the auxiliary cathode layer is disposed on a side of the backplane, thereby reducing damage to the light-emitting element during the manufacturing process.

FIG. 1 is a schematic cross-sectional view showing a display substrate according to an embodiment of the present disclosure.

As shown in FIG. 1, the display substrate comprises a backplane 100 and a transistor layer 110 on a side of the backplane 100. For example, the transistor layer 100 may comprise: an active layer 111 on a side of the backplane 100, a gate insulating layer 112 on a side of the active layer 111 away from the backplane, a gate layer 113 on a side of the gate insulating layer 112 away from the active layer 111, and a first electrode 114 and a second electrode 115 each electrically connected to the active layer 111. For example, the first electrode 114 is a source and the second electrode 115 is a drain. As another example, the first electrode 114 is a drain, and the second electrode 115 is a source.

As shown in FIG. 1, the display substrate further comprises a first planarization layer 121 on a side of the transistor layer 110 away from the backplane 100. For example, a material of the first planarization layer 121 is an organic insulating material (for example, PMMA (polymethylmethacrylate, also referred to as acryl) or resin). In some embodiments, a thickness of the first planarization layer 121 ranges from 0.5 micrometers to 5 micrometers. For example, the thickness of the first planarization layer may be 1 micrometer, 2 micrometers, or 3 micrometers, etc.

As shown in FIG. 1, the display substrate further comprises an auxiliary cathode layer 130 on a side of the first planarization layer 121 away from the transistor layer 110. In some embodiments, a material of the auxiliary cathode layer 130 may comprise a metal material. For example, the material of the auxiliary cathode layer 130 may comprise copper, aluminum, titanium, or silver, etc. As another example, the auxiliary cathode layer may have a three-layer structure of Ti/Al/Ti (titanium/aluminum/titanium).

As shown in FIG. 1, the display substrate further comprises a second planarization layer 122 on a side of the auxiliary cathode layer 130 away from the first planarization layer 121. For example, a material of the second planarization layer 122 is an organic insulating material (for example, PMMA or resin). In some embodiments, a thickness of the second planarization layer 122 ranges from 0.5 micrometers to 5 micrometers. For example, the thickness of the second planarization layer may be 1 micrometer, 2 micrometers, or 3 micrometers, etc.

As shown in FIG. 1, the display substrate further comprises a light-emitting element layer 140 on a side of the second planarization layer 122 away from the auxiliary cathode layer 130. The light-emitting element layer 140 comprises a primary cathode layer 141. The primary cathode layer 141 is electrically connected to the auxiliary cathode layer 130. For example, the primary cathode layer 141 is a transparent electrode layer.

Heretofore, a display substrate according to some embodiments of the present disclosure is provided. The display substrate comprises: a backplane, a transistor layer on a side of the backplane, a first planarization layer on a side of the transistor layer away from the backplane, an auxiliary cathode layer on a side of the first planarization layer away from the transistor layer, a second planarization layer on a size of the auxiliary cathode layer away from the first planarization layer, and a light-emitting element layer on a side of the second planarization layer away from the auxiliary cathode layer. The light-emitting element layer comprises a primary cathode layer. The primary cathode layer is electrically connected to the auxiliary cathode layer. Therefore, in the display substrate, the auxiliary cathode layer is provided on a side of the backplane, that is, the auxiliary cathode layer is not provided on a side of the cover plate, so that damage to the light-emitting element during the manufacturing process can be reduced.

In the embodiments of the present disclosure, the auxiliary cathode layer is made on the backplane by adding layers on the backplane, so that the auxiliary cathode layer is bonded to the transparent cathode (i.e., the primary cathode layer) in the display area, so as to reduce the impedance of the primary cathode layer, and thereby reducing Vss IR Rise.

In addition, since the auxiliary cathode layer is not in the same layer as other structural layers, the size of the auxiliary cathode layer can be made relatively large, so that the auxiliary cathode layer may be applied to a display substrate having a larger size.

In the above embodiment, planarization layers (for example, planarization organic films) are provided above and below the auxiliary cathode layer. The planarization layer may have the effect of planarizing the backplane layer. Moreover, two planarization layers are provided, so that a better planarization effect is achieved. Furthermore, the planarization layer (for example, the first planarization layer) may reduce an increase of the parasitic capacitance of the signal line caused by the auxiliary cathode layer. For example, the auxiliary cathode layer may be designed to be relatively large, so that its overlapping area with the signal line may be relatively large. The above planarization layer (such as the first planarization layer) may increase the distance between the auxiliary cathode layer and the signal line, thereby reducing parasitic capacitance of the signal line. The thickness of the planarization layer may be in the micrometer range, so that the parasitic capacitance of the signal line will not increase too much. A thicker planarization layer may also ensure that the additional auxiliary cathode will not cause an increase in the defective rate of display panels as much as possible.

In some embodiments, as shown in FIG. 1, the light-emitting element layer 140 may further comprise a pixel defining layer 142. The pixel defining layer 142 is used to define a pixel light-emitting opening 145. The light-emitting element layer 140 may further comprise an anode layer 143 on a side of the second planarization layer 122 away from the auxiliary cathode layer 130. The anode layer 143 is electrically connected to the transistor layer 110. For example, the anode layer 143 is electrically connected to the first electrode 114 through a third via-hole 163. The third via-hole 163 passes through the first planarization layer 121 and the second planarization layer 122. The pixel defining layer 142 covers a portion of the anode layer 143. The light-emitting element layer 140 may further comprise a light-emitting function layer 144 on a side of the anode layer 143 away from the second planarization layer 122. The light-emitting function layer 144 is in the pixel light-emitting opening 145. The primary cathode layer 141 is on a side of the light-emitting function layer 144 away from the anode layer 143.

In some embodiments, as shown in FIG. 1, the display substrate may further comprise a conductive layer 150 that is on the same layer as the anode layer 143 and is isolated from the anode layer 143. A material of the conductive layer 150 is the same as that of the anode layer 143.

It should be noted that "the same layer" refers to a layer structure that is formed by forming a film layer of specific patterns in the same film formation process and then patterned by applying the same mask plate in a single patterning process. Depending on the specific patterns, the single patterning process may comprise multiple exposure, development or etching processes, and the specific patterns in the formed layer structure may or may not be continuous. These specific patterns may also be at different heights or have different thicknesses.

As shown in FIG. 1, the primary cathode layer 141 is electrically connected to the conductive layer 150 through a first via-hole 161. The first via-hole 161 passes through the pixel defining layer 142. The conductive layer 150 is electrically connected to the auxiliary cathode layer 130 through a second via-hole 162. The second via-hole 162 passes through the second planarization layer 122. That is, in the display area, the auxiliary cathode layer is bonded to the primary cathode layer through the above conductive layer. In some embodiments, as shown in FIG. 1, an orthographic projection of the first via-hole 161 on the backplane 100 does not overlap with an orthographic projection of the second via-hole 162 on the backplane 100. That is, at the position where the auxiliary cathode layer is bonded to the primary cathode layer, the first via-hole and the second via-hole for bonding are staggered, which may prevent the occurrence of cracks caused by an excessively large height difference between the primary cathode layer and the anode layer.

In some embodiments, as shown in FIG. 1, the display substrate may further comprise a buffer layer 170 between the backplane 100 and the transistor layer 110. The display substrate may further comprise a shielding layer 180 between the buffer layer 170 and the backplane 100. An orthographic projection of the shielding layer 180 on the backplane 100 at least partially overlaps with an orthographic projection of the light-emitting function layer 144 on the backplane 100. The shielding layer may be used to block external ambient light to reduce the influence of the external ambient light on the characteristics of the thin film transistor. In addition, the shielding layer may also be used for storage capacitors or wires in pixels. A material of the shielding layer may be an opaque conductor, such as Mo (molybdenum) or MoNb (molybdenum-niobium), etc.

In some embodiments, as shown in FIG. 1, the display substrate may further comprise an inorganic protective layer 190 between the first planarization layer 121 and the transistor layer 110. The inorganic protective layer may be used to prevent the metal of the source or drain layer from being oxidized. For example, the material of the source or drain is copper, which may be oxidized when the source or drain is exposed in the air for too long. For example, a material of the inorganic protective layer 190 may comprise an insulating material (such as silicon nitride). The third via-hole 163 may also pass through the inorganic protective layer 190. Of course, those skilled in the art can understand that the display substrate may not be provided with the inorganic protective layer.

In some embodiments, as shown in FIG. 1, the display substrate may further comprise an interlayer dielectric layer 175 between the buffer layer 170 and the inorganic protective layer 190. For example, a material of the interlayer dielectric layer 175 may comprise silicon dioxide, silicon nitride, or the like.

Figure 2:
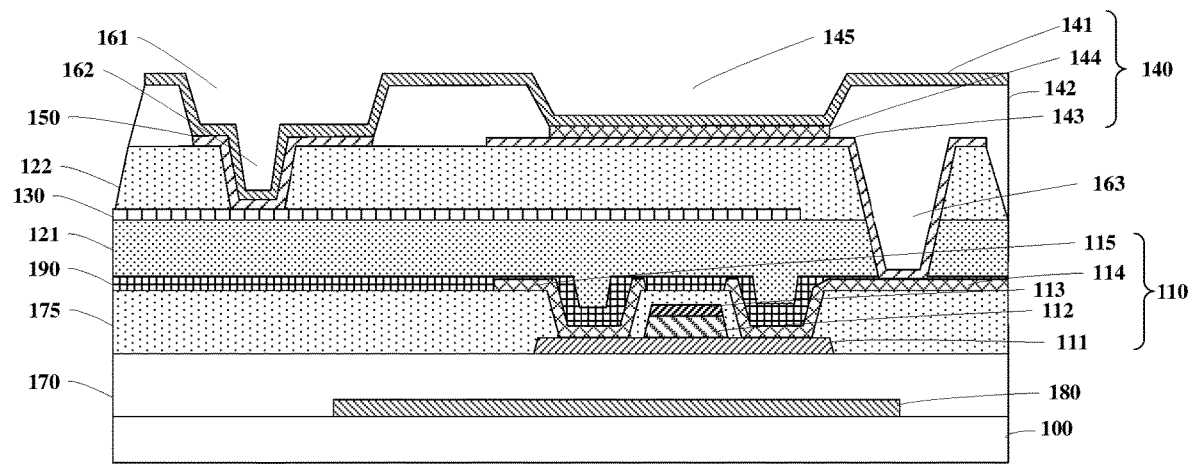
FIG. 2 is a schematic cross-sectional view showing a display substrate according to another embodiment of the present disclosure.

FIG. 2 is a schematic cross-sectional view showing a display substrate according to another embodiment of the present disclosure. A structure of the display substrate shown in FIG. 2 is similar to that of the display substrate shown in FIG. 1. Here, the structure similar to FIG. 1 in FIG. 2 will not be described again. Compared with the display substrate shown in FIG. 1, the display substrate shown in FIG. 2 is different in that the orthographic projection of the first via-hole 161 on the backplane 100 at least partially overlaps with the orthographic projection of the second via-hole 162 on the backplane 100. For example, the orthographic projection of the second via-hole 162 on the backplane 100 is located inside the orthographic projection of the first via-hole 161 on the backplane 100. That is, in this embodiment, the first via-hole is aligned with the second via-hole, which can save layout space.

Figure 3:
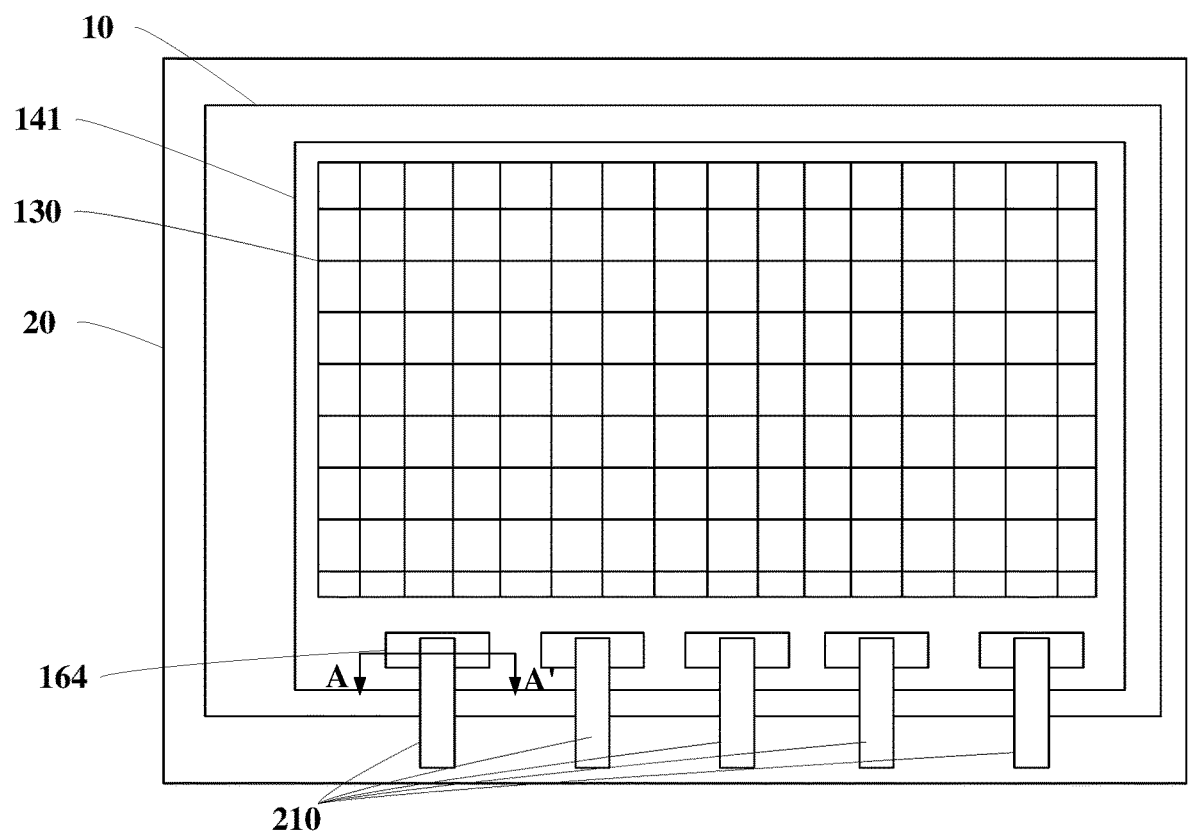
FIG. 3 is a top view showing a display substrate according to an embodiment of the present disclosure.

FIG. 3 is a top view showing a display substrate according to an embodiment of the present disclosure.

In some embodiments, as shown in FIG. 3, the auxiliary cathode layer 130 has a grid shape. The auxiliary cathode layer having the grid shape may better reduce the voltage drop and may reduce cross talk. In addition, the grid shape may prevent charge from accumulating on the auxiliary cathode layer, and thereby is conducive to the operation of the display substrate.

In some embodiments, as shown in FIG. 3, the display substrate 130 may comprise a display area 10 and a peripheral area 20 surrounding the display area. The auxiliary cathode layer 130 is disposed in the display area 10.

Figure 4:
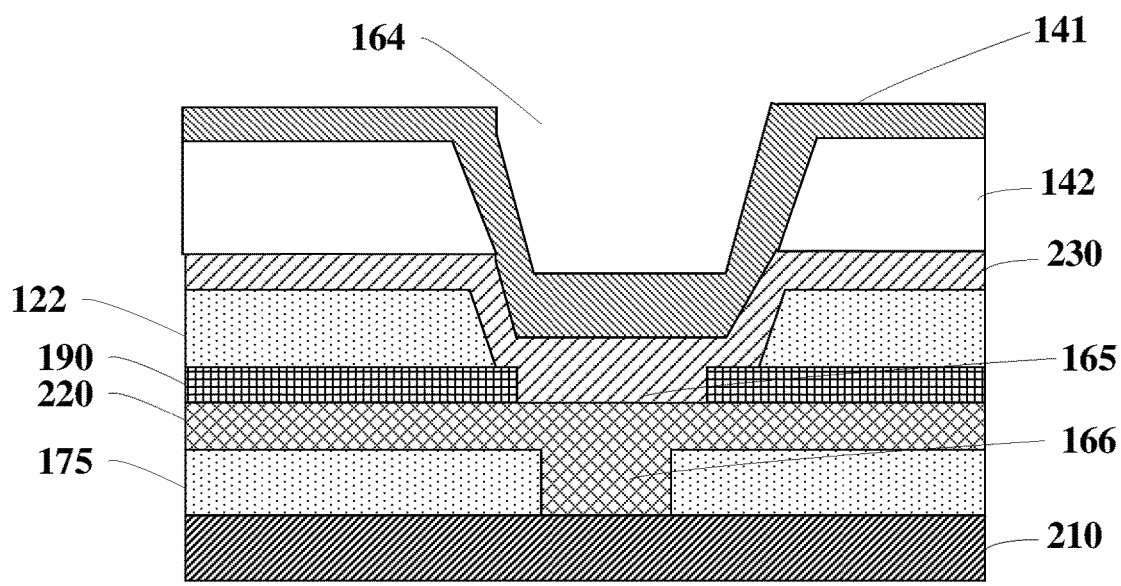
FIG. 4 is a schematic cross-sectional view showing a structure taken along a line A-A' in FIG. 3.

In some embodiments, as shown in FIG. 3, the primary cathode layer 141 is electrically connected to a common wire 210 for transmitting a common ground voltage signal Vss. The common wire 210 is disposed in the peripheral area 20. The common wire 210 may be electrically connected to the primary cathode layer 141 through a fourth via-hole 164, a fifth via-hole, and a sixth via-hole (the fifth via-hole and the sixth via-hole are shown in FIG. 4). The auxiliary cathode layer 130 is electrically connected to the common wire 210 through the primary cathode layer 141. That is, in this embodiment, instead of being directly electrically connected to the common wire 210, the auxiliary cathode layer 130 is electrically connected to the common wire through the primary cathode layer 141.

If the auxiliary cathode layer is directly connected to the common wire 210 in the peripheral area, it may be necessary to bridge the auxiliary cathode to the common wire, which may increase the risk of the auxiliary cathode being shorted with other wires. In the above embodiment, the auxiliary cathode layer is electrically connected to the common wire through the primary cathode layer, which may reduce the above risk caused by the auxiliary cathode layer crossing with other wires.

Of course, those skilled in the art should understand that the auxiliary cathode layer may also be directly electrically connected to the common wire.

Simulation and actual experimental test results show that for an auxiliary cathode directly connected to the common wire and an auxiliary cathode indirectly connected to the common wire, they have almost the same effect on the cathode voltage drop.

FIG. 4 is a schematic cross-sectional view showing a structure taken along a line A-A' in FIG. 3.

As shown in FIG. 4, the primary cathode layer 141 may be electrically connected to a first metal layer 230 through the fourth via-hole 164. The fourth via-hole 164 passes through the pixel defining layer 142 and the second planarization layer 122. The first metal layer 230 may be on the same layer as the anode layer 143. For example, a material of the first metal layer 230 is the same as that of the anode layer 143.

As shown in FIG. 4, the first metal layer 230 is electrically connected to a second metal layer 220 through a fifth via-hole 165. The fifth via-hole 165 passes through the inorganic protective layer 190. The second metal layer 220 may be on the same layer as the first electrode 114 or the second electrode 115. For example, a material of the second metal layer 220 is the same as that of the first electrode 114 or the second electrode 115.

As shown in FIG. 4, the second metal layer 220 is electrically connected to the common wire 210 through a sixth via-hole 166. The sixth via-hole 166 passes through the interlayer dielectric layer 175. The common wire 210 may be on the same layer as the gate layer 113. For example, a material of the common wire 210 is the same as that of the gate layer 113.

Heretofore, the above embodiment describes the manner in which the primary cathode layer 141 is electrically connected to the common wire 210. Through such a connection, the common wire 210 may transmit the common ground voltage signal Vss to the primary cathode layer. That is, the cathode signal (that is, the common ground voltage signal Vss) is supplied to the primary cathode layer through a peripheral circuit. After the cathode signal enters the display panel, it may be transmitted to the primary cathode layer and the auxiliary cathode layer through backplane wires.

The display panel of embodiments of the present disclosure may not be limited by the pixel circuit structure, the driving method of the Vss signal, the supplying method of the Vss signal, and the structure of the backplane TFT (Thin Film Transistor). In addition, the display substrate according to embodiments of the present disclosure may be applied to a top gate structure or a bottom gate structure (for example, a BCE (Back Channel Etch) structure or an ESL (Electronic Stop Layer) structure, etc.).

In some embodiments of the present disclosure, a display device is further provided. The display device may comprise the display substrate (such as the display substrate shown in FIG. 1 or FIG. 2) as described above. For example, the display device may be any product or component having a display function, such as a display panel, a mobile phone, a tablet computer, a television, a display, a notebook computer, a digital photo frame, a navigator, and the like.

Figure 5:
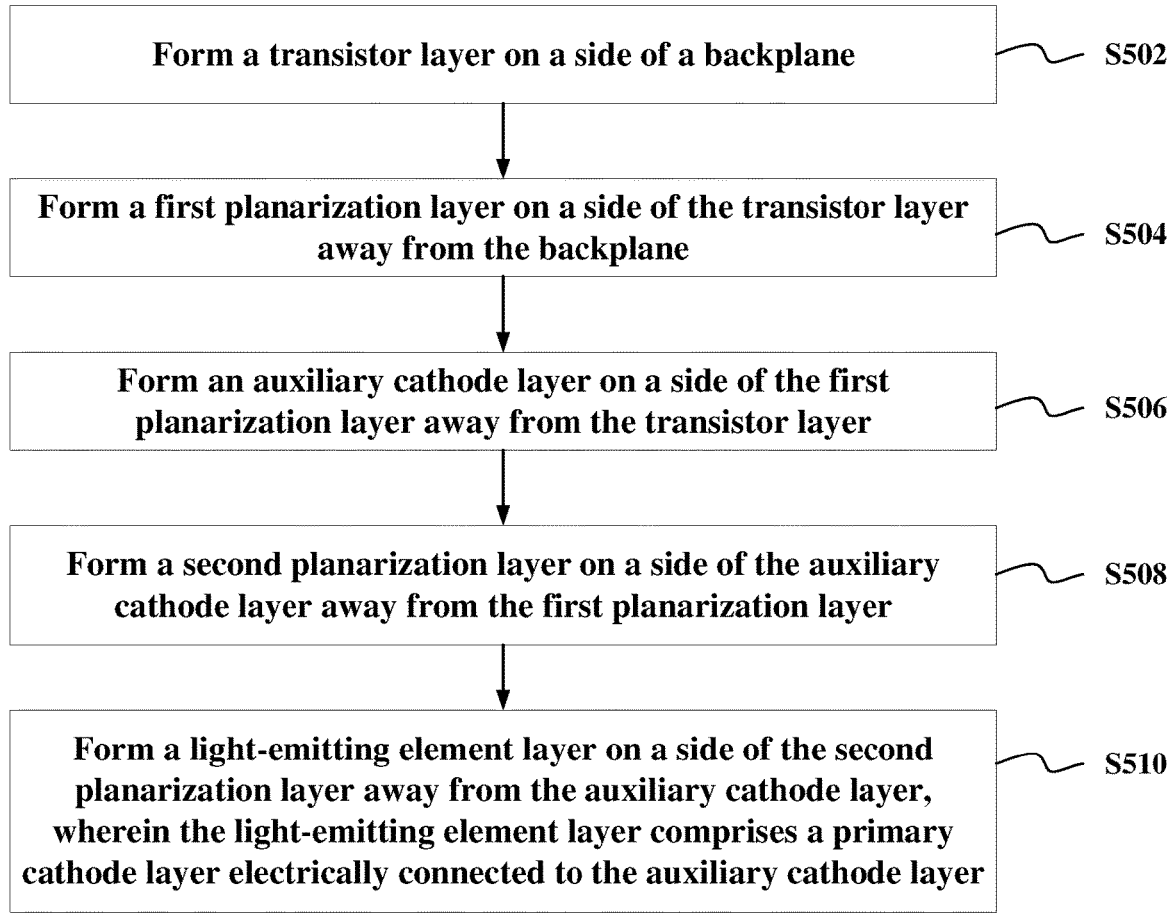
FIG. 5 is a flowchart showing a manufacturing method for a display substrate according to an embodiment of the present disclosure.

FIG. 5 is a flowchart showing a manufacturing method for a display substrate according to an embodiment of the present disclosure. FIGS. 6 to 9 are schematic cross-sectional views showing the structures in several stages of the manufacturing process of a display substrate according to an embodiment of the present disclosure. The manufacturing process of the display substrate according to some embodiments of the present disclosure will be described in detail with reference to FIGS. 5, 6 to 9, and 1.

As shown in FIG. 5, at step S502, a transistor layer is formed on a side of a backplane.

Figure 6:
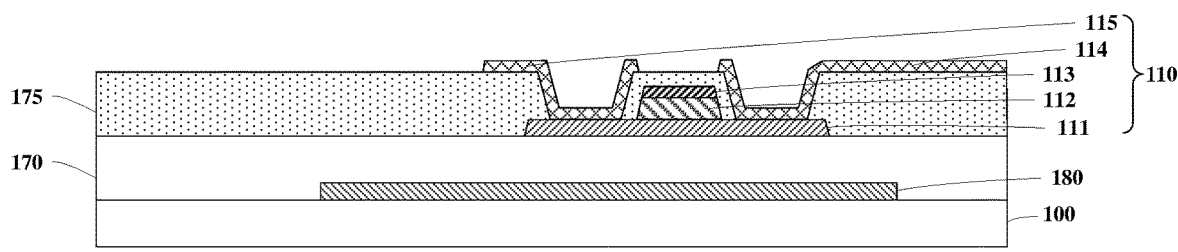
FIG. 6 is a schematic cross-sectional view showing a structure in a stage of the manufacturing process of a display substrate according to an embodiment of the present disclosure.

FIG. 6 shows a schematic cross-sectional view of the structure in step S502 according to some embodiments of the present disclosure.

For example, as shown in FIG. 6, before forming the transistor layer, the manufacturing method may further comprise: forming a shielding layer 180 on a side of the backplane 100; and forming a buffer layer 170 covering the shielding layer 180 and the backplane 100.

Next, a transistor layer 110 is formed. The transistor layer 110 is formed on a side of the buffer layer 170 away from the backplane 100. The process of forming the transistor layer will be described below.

As shown in FIG. 6, an active layer 111 is formed on a side of the backplane 100. The active layer 111 is formed on a side of the buffer layer 170 away from the backplane 100, for example, by a deposition process and a patterning process.

Next, as shown in FIG. 6, a gate insulating layer 112 is formed on a side of the active layer 111 away from the backplane 100 by a deposition process and a patterning process.

Next, as shown in FIG. 6, a gate layer 113 is formed on a side of the gate insulating layer 112 away from the active layer 111 by a deposition process and a patterning process.

Next, as shown in FIG. 6, a first electrode 114 and a second electrode 115 each electrically connected to the active layer 111 are formed. For example, as shown in FIG. 6, an interlayer dielectric layer 175 covering the active layer 111, the gate insulating layer 112, and the gate layer 113 may be formed; then the interlayer dielectric layer 175 is patterned to form two via-holes exposing a portion of the active layer 111; the first electrode 114 and the second electrode 115 respectively passing through the two via-holes are formed by a deposition process and a patterning process. The first electrode 114 and the second electrode 115 are in contact with the active layer 111, respectively.

So far, a transistor layer 110 is formed on a side of the backplane 100.

Returning to FIG. 5, at step S504, a first planarization layer is formed on a side of the transistor layer away from the backplane.

Figure 7:
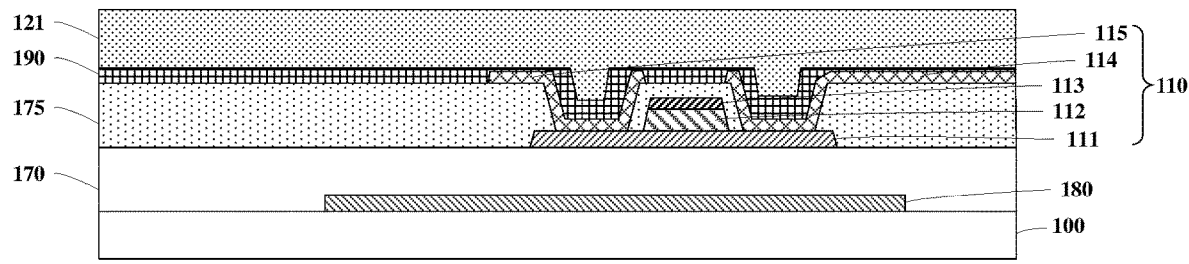
FIG. 7 is a schematic cross-sectional view showing a structure in another stage of the manufacturing process of a display substrate according to an embodiment of the present disclosure.

FIG. 7 shows a schematic cross-sectional view of the structure at step S504 according to some embodiments of the present disclosure. As shown in FIG. 7, a first planarization layer 121 is formed on a side of the transistor layer 110 away from the backplane 100.

In some embodiments, an inorganic protective layer 190 covering the structure shown in FIG. 6 may be formed; then the first planarization layer 121 is formed on a side of the inorganic protective layer 190 away from the backplane 100.

Returning to FIG. 5, at step S506, an auxiliary cathode layer is formed on a side of the first planarization layer away from the transistor layer.

Figure 8:
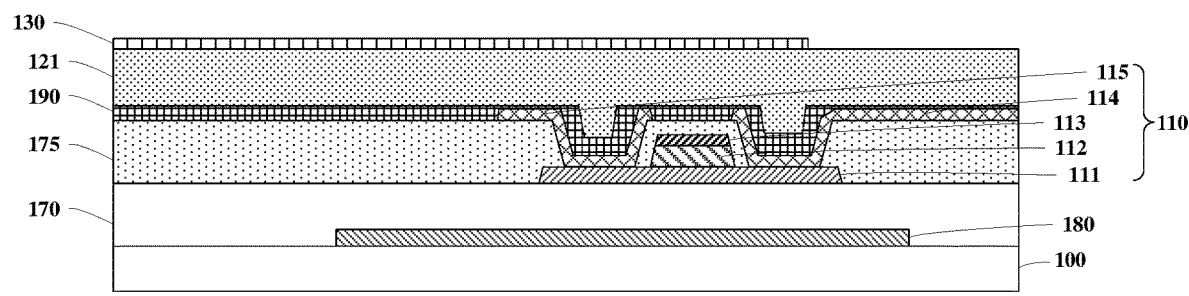
FIG. 8 is a schematic cross-sectional view showing a structure in another stage of the manufacturing process of a display substrate according to an embodiment of the present disclosure.

FIG. 8 shows a schematic cross-sectional view of the structure at step S506 according to some embodiments of the present disclosure. As shown in FIG. 8, an auxiliary cathode layer 130 may be formed on a side of the first planarization layer 121 away from the transistor layer 110 by a deposition process and a patterning process.

Returning to FIG. 5, at step S508, a second planarization layer is formed on a side of the auxiliary cathode layer away from the first planarization layer.

Figure 9:
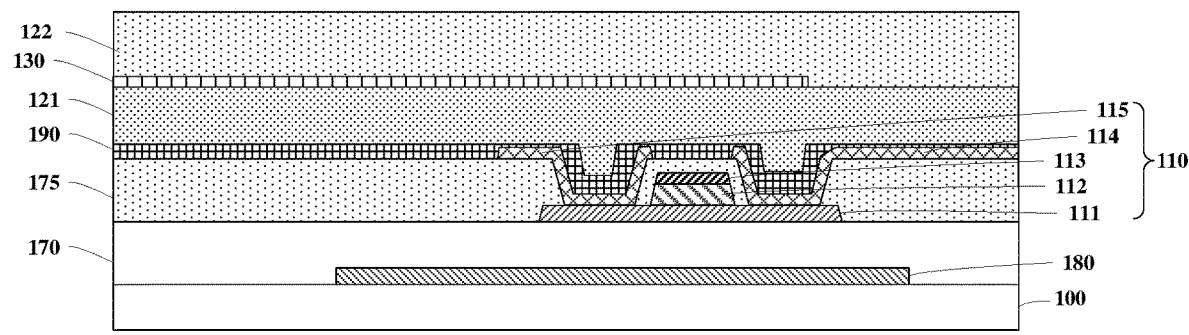
FIG. 9 is a schematic cross-sectional view showing a structure in another stage of the manufacturing process of a display substrate according to an embodiment of the present disclosure.

FIG. 9 shows a schematic cross-sectional view of the structure at step S508 according to some embodiments of the present disclosure. As shown in FIG. 9, a second planarization layer 122 is formed on a side of the auxiliary cathode layer 130 away from the first planarization layer 121.

Returning to FIG. 5, at step S510, a light-emitting element layer is formed on a side of the second planarization layer away from the auxiliary cathode layer. The light-emitting element layer comprises a primary cathode layer electrically connected to the auxiliary cathode layer.

FIG. 1 shows a schematic cross-sectional view of the structure at step S510 according to some embodiments of the present disclosure. The process of forming the light-emitting element layer will be described below with reference to FIG. 1.

As shown in FIG. 1, an anode layer 143 is formed on a side of the second planarization layer 122 away from the auxiliary cathode layer 130. The anode layer 143 is electrically connected to the transistor layer 110. In some embodiments, the step of forming the anode layer may comprise: forming a third via-hole 163 passing through the first planarization layer 121 and the second planarization layer 122, and forming the anode layer 143 electrically connected to the first electrode 114 through the third via-hole 163. For example, if there is an inorganic protective layer, the third via-hole 163 may also pass through the inorganic protective layer.

In some embodiments, in a process of forming the anode layer 143, a conductive layer 150 that is on the same layer as the anode layer 143 and is isolated from the anode layer 143 is also formed. For example, the step of forming the conductive layer 150 may comprise: forming a second via-hole 162 passing through the second planarization layer 122. The second via-hole 162 exposes a portion of the auxiliary cathode layer 130. The step of forming the conductive layer 150 may further comprise: forming the conductive layer 150 electrically connected to the portion of the auxiliary cathode layer 130 through the second via-hole 162.

Next, as shown in FIG. 1, a pixel defining layer 142 covering the anode layer 143 is formed, for example, by a deposition process and a patterning process. The pixel defining layer 142 is provided with a pixel light-emitting opening 145 exposing at least a portion of the anode layer 143.

Next, as shown in FIG. 1, a light-emitting function layer 144 is formed in the pixel light-emitting opening 145 and on the anode layer 143. After the light-emitting function layer is formed, an orthographic projection of the shielding layer 180 on the backplane 100 at least partially overlaps with an orthographic projection of the light-emitting function layer 144 on the backplane 100.

Next, as shown in FIG. 1, a primary cathode layer 141 is formed on a side of the light-emitting function layer 144 away from the anode layer 143.

For example, the step of forming the primary cathode layer 144 may comprise: forming a first via-hole 161 passing through the pixel defining layer 142, for example, by a patterning process. The first via-hole 161 exposes at least a portion of the conductive layer 150. For example, as shown in FIG. 1, an orthographic projection of the first via-hole 161 on the backplane 100 does not overlap with an orthographic projection of the second via-hole 162 on the backplane 100. The step of forming the primary cathode layer 144 may further comprise: forming the primary cathode layer 141 electrically connected to the at least a portion of the conductive layer 150 through the first via-hole 161.

The above embodiment describes the process of forming the light-emitting element layer.

Heretofore, a manufacturing method for the display substrate according to some embodiments of the present disclosure has been described. The manufacturing method comprises: forming a transistor layer on a side of a backplane; forming a first planarization layer on a side of the transistor layer away from the backplane; forming an auxiliary cathode layer on a side of the first planarization layer away from the transistor layer; forming a second planarization layer on a side of the auxiliary cathode layer away from the first planarization layer; and forming a light-emitting element layer on a side of the second planarization layer away from the auxiliary cathode layer. The light-emitting element layer comprises a primary cathode layer. The primary cathode layer is electrically connected to the auxiliary cathode layer. In this manufacturing method, the auxiliary cathode layer is formed on a side of the backplane, that is, the auxiliary cathode layer is not formed on a side of a cover plate, so that damage to the light-emitting element during the manufacturing process may be reduced.

The manufacturing process of the display substrate in the case where the first via-hole and the second via-hole are staggered has been described above.

In other embodiments, an orthographic projection of the first via-hole 161 on the backplane 100 at least partially overlaps with an orthographic projection of the second via-hole 162 on the backplane 100. That is, the first via-hole is aligned with the second via-hole. The manufacturing process of the display substrate in the case where the first via-hole is aligned with the second via-hole is similar to that described above, except that in the two manufacturing processes, the first via-hole 161 and the second via-hole 162 have different relative positions. For example, in the case where the first via-hole is aligned with the second via-hole, in the process of manufacturing the two via-holes, the first via-hole is substantially aligned with the second via-hole.

Heretofore, various embodiments of the present disclosure have been described in detail. In order to avoid obscuring the concepts of the present disclosure, some details known in the art are not described. Based on the above description, those skilled in the art can understand how to implement the technical solutions disclosed herein.

Although some specific embodiments of the present disclosure have been described in detail by way of example, those skilled in the art should understand that the above examples are only for the purpose of illustration and are not intended to limit the scope of the present disclosure. It should be understood by those skilled in the art that the above embodiments may be modified or equivalently substituted for part of the technical features without departing from the scope and spirit of the present disclosure. The scope of the disclosure is defined by the following claims.

What is claimed is:

1. A display substrate, comprising:
a backplane;
a transistor layer on a side of the backplane;
a first planarization layer on a side of the transistor layer away from the backplane;
an auxiliary cathode layer on a side of the first planarization layer away from the transistor layer, wherein the auxiliary cathode layer has a grid shape;
a second planarization layer on a side of the auxiliary cathode layer away from the first planarization layer; and
a light-emitting element layer on a side of the second planarization layer away from the auxiliary cathode layer, wherein the light-emitting element layer comprises a primary cathode layer electrically connected to the auxiliary cathode layer.

2. The display substrate according to claim 1, wherein a material of the first planarization layer and a material of the second planarization layer are organic insulating materials.

3. The display substrate according to claim 1, wherein a thickness of the first planarization layer ranges from 0.5 micrometers to 5 micrometers; and
a thickness of the second planarization layer ranges from 0.5 micrometers to 5 micrometers.

4. The display substrate according to claim 1, wherein the light-emitting element layer further comprises:
a pixel defining layer for defining a pixel light-emitting opening;
an anode layer on a side of the second planarization layer away from the auxiliary cathode layer, wherein the anode layer is electrically connected to the transistor layer; and
a light-emitting function layer on a side of the anode layer away from the second planarization layer, wherein the light-emitting function layer is in the pixel light-emitting opening;
wherein the primary cathode layer is on a side of the light-emitting function layer away from the anode layer.

5. The display substrate according to claim 4, further comprising: a conductive layer that is on the same layer as the anode layer and is isolated from the anode layer;
wherein the primary cathode layer is electrically connected to the conductive layer through a first via-hole passing through the pixel defining layer, and the conductive layer is electrically connected to the auxiliary cathode layer through a second via-hole passing through the second planarization layer.

6. The display substrate according to claim 5, wherein an orthographic projection of the first via-hole on the backplane does not overlap with an orthographic projection of the second via-hole on the backplane.

7. The display substrate according to claim 5, wherein an orthographic projection of the first via-hole on the backplane at least partially overlaps with an orthographic projection of the second via-hole on the backplane.

8. The display substrate according to claim 4, wherein the transistor layer comprises:
an active layer on a side of the backplane;
a gate insulating layer on a side of the active layer away from the backplane;
a gate layer on a side of the gate insulating layer away from the active layer; and
a first electrode and a second electrode each electrically connected to the active layer, wherein the anode layer is electrically connected to the first electrode through a third via-hole passing through the first planarization layer and the second planarization layer.

9. The display substrate according to claim 4, further comprising:
a buffer layer between the backplane and the transistor layer; and
a shielding layer between the buffer layer and the backplane, wherein an orthographic projection of the shielding layer on the backplane at least partially overlaps with an orthographic projection of the light-emitting function layer on the backplane.

10. The display substrate according to claim 1, wherein the display substrate comprises a display area and a peripheral area surrounding the display area, the auxiliary cathode layer being disposed in the display area.

11. The display substrate according to claim 10, wherein the primary cathode layer is electrically connected to a common wire for transmitting a common ground voltage signal, the common wire is disposed in the peripheral area, and the auxiliary cathode layer is electrically connected to the common wire through the primary cathode layer.

12. A display device, comprising: the display substrate according to claim $.

13. A manufacturing method for a display substrate, comprising:
forming a transistor layer on a side of a backplane;
forming a first planarization layer on a side of the transistor layer away from the backplane;
forming an auxiliary cathode layer on a side of the first planarization layer away from the transistor layer, wherein the auxiliary cathode layer has a grid shape;
forming a second planarization layer on a side of the auxiliary cathode layer away from the first planarization layer; and
forming a light-emitting element layer on a side of the second planarization layer away from the auxiliary cathode layer, wherein the light-emitting element layer comprises a primary cathode layer electrically connected to the auxiliary cathode layer.

14. The manufacturing method according to claim 13, wherein the forming of the light-emitting element layer comprises:
forming an anode layer on a side of the second planarization layer away from the auxiliary cathode layer, wherein the anode layer is electrically connected to the transistor layer;
forming a pixel defining layer covering the anode layer, the pixel defining layer being provided with a pixel light-emitting opening exposing at least a portion of the anode layer;
forming a light-emitting function layer in the pixel light-emitting opening and on the anode layer; and
forming the primary cathode layer on a side of the light-emitting function layer away from the anode layer.

15. The manufacturing method according to claim 14, wherein
in a process of forming the anode layer, a conductive layer that is on the same layer as the anode layer and is isolated from the anode layer is also formed;
the forming of the conductive layer comprises: forming a second via-hole passing through the second planarization layer, the second via-hole exposing a portion of the auxiliary cathode layer, and forming the conductive layer electrically connected to the portion of the auxiliary cathode layer through the second via-hole; and the forming of the primary cathode layer comprises: forming a first via-hole passing through the pixel defining layer, the first via-hole exposing at least a portion of the conductive layer, and forming the primary cathode layer electrically connected to the at least a portion of the conductive layer through the first via-hole.

16. The manufacturing method according to claim 15, wherein an orthographic projection of the first via-hole on the backplane does not overlap with an orthographic projection of the second via-hole on the backplane.

17. The manufacturing method according to claim 15, wherein an orthographic projection of the first via-hole on the backplane at least partially overlaps with an orthographic projection of the second via-hole on the backplane.

18. The manufacturing method according to claim 14, wherein the forming of the transistor layer comprises: forming an active layer on a side of the backplane; forming a gate insulating layer on a side of the active layer away from the backplane; forming a gate layer on a side of the gate insulating layer away from the active layer; and forming a first electrode and a second electrode each electrically connected to the active layer; and the forming of the anode layer comprises: forming a third via-hole passing through the first planarization layer and the second planarization layer, and forming the anode layer electrically connected to the first electrode through the third via-hole.

19. The manufacturing method according to claim 14, wherein before forming the transistor layer, the manufacturing method further comprises:

forming a shielding layer on a side of the backplane; and forming a buffer layer covering the shielding layer and the backplane;

wherein the transistor layer is formed on a side of the buffer layer away from the backplane;

after forming the light-emitting function layer, an orthographic projection of the shielding layer on the backplane at least partially overlaps with an orthographic projection of the light-emitting function layer on the backplane.

* * * * *

UNITED STATES PATENT AND TRADEMARK OFFICE
CERTIFICATE OF CORRECTION

PATENT NO. : 11,322,713 B2
APPLICATION NO. : 16/818246
DATED : May 3, 2022
INVENTOR(S) : Pan Xu

It is certified that error appears in the above-identified patent and that said Letters Patent is hereby corrected as shown below:

In the Claims

Column 14, Line 27, Claim 12, delete "claim $." and insert -- claim 1. --

Signed and Sealed this
Twenty-eighth Day of June, 2022

Katherine Kelly Vidal
*Director of the United States Patent and Trademark Office*